US007554428B2

United States Patent
Yamamoto et al.

(10) Patent No.: US 7,554,428 B2
(45) Date of Patent: Jun. 30, 2009

(54) BOUNDARY ACOUSTIC WAVE DEVICE COMPRISING NI DIFFUSED IN AU AND METHOD FOR MANUFACTURING THE SAME

(75) Inventors: Daisuke Yamamoto, Muko (JP); Hajime Kando, Ritto (JP); Akihiro Teramoto, Ishikawa-gun (JP); Toshiyuki Fuyutsume, Moriyama (JP); Masahiko Saeki, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/190,620

(22) Filed: Aug. 13, 2008

(65) Prior Publication Data

US 2008/0290968 A1 Nov. 27, 2008

Related U.S. Application Data

(63) Continuation of application No. PCT/JP2007/051004, filed on Jan. 23, 2007.

(30) Foreign Application Priority Data

Feb. 23, 2006 (JP) ............................. 2006-047070

(51) Int. Cl.
*H03H 9/145* (2006.01)
*H03H 9/25* (2006.01)
*H03H 3/08* (2006.01)
*H01L 41/047* (2006.01)
*H01L 41/18* (2006.01)
*H01L 41/22* (2006.01)

(52) U.S. Cl. ................... 333/193; 333/195; 310/313 B; 310/313 D; 310/364; 29/25.35

(58) Field of Classification Search ......... 333/193–196; 310/313 B, 313 D, 364; 29/25.35
See application file for complete search history.

(56) References Cited

U.S. PATENT DOCUMENTS 5,909,156 A 6/1999 Nishihara et al.
6,388,361 B1 5/2002 Nishihara et al.
6,657,366 B2 * 12/2003 Watanabe et al. ........... 310/364

(Continued)

FOREIGN PATENT DOCUMENTS

JP 61-006919 A 1/1986

(Continued)

OTHER PUBLICATIONS

Official Communication issued in International Patent Application No. PCT/JP2007/051004, mailed on Apr. 24, 2007.

(Continued)

*Primary Examiner*—Barbara Summons
(74) *Attorney, Agent, or Firm*—Keating & Bennett, LLP

(57) ABSTRACT

A boundary acoustic wave device includes a first medium, a second medium, and an IDT electrode disposed at an interface between the first medium and the second medium, the IDT electrode having an Au layer defining a main electrode layer, wherein a Ni layer is laminated so as to contact at least one surface of the Au layer, and a portion of Ni defining the Ni layer is diffused from the Ni layer side surface of the Au layer toward the inside of the Au layer.

10 Claims, 9 Drawing Sheets

U.S. PATENT DOCUMENTS

| | | | |
|---|---|---|---|
| 6,700,312 B2 * | 3/2004 | Iizuka et al. | 310/364 |
| 7,180,223 B2 * | 2/2007 | Ozaki et al. | 310/313 A |
| 7,218,039 B2 * | 5/2007 | Hada et al. | 310/364 |
| 7,301,255 B2 * | 11/2007 | Ito et al. | 310/313 R |
| 2002/0158699 A1 | 10/2002 | Iizuka et al. | |
| 2006/0071579 A1 | 4/2006 | Kando | |
| 2007/0159026 A1 * | 7/2007 | Kando | 310/313 D |

FOREIGN PATENT DOCUMENTS

| | | |
|---|---|---|
| JP | 61-047010 B2 | 10/1986 |
| JP | 08-204493 A | 8/1996 |
| JP | 10-041328 A | 2/1998 |

OTHER PUBLICATIONS

Cullen et al.: "Surface and Interface Acoustic Waves in SiO2/YX-LiNbO3," Appl. Phys. Lett., vol. 44, No. 2, Jan. 15, 1984, pp. 182-184.

* cited by examiner

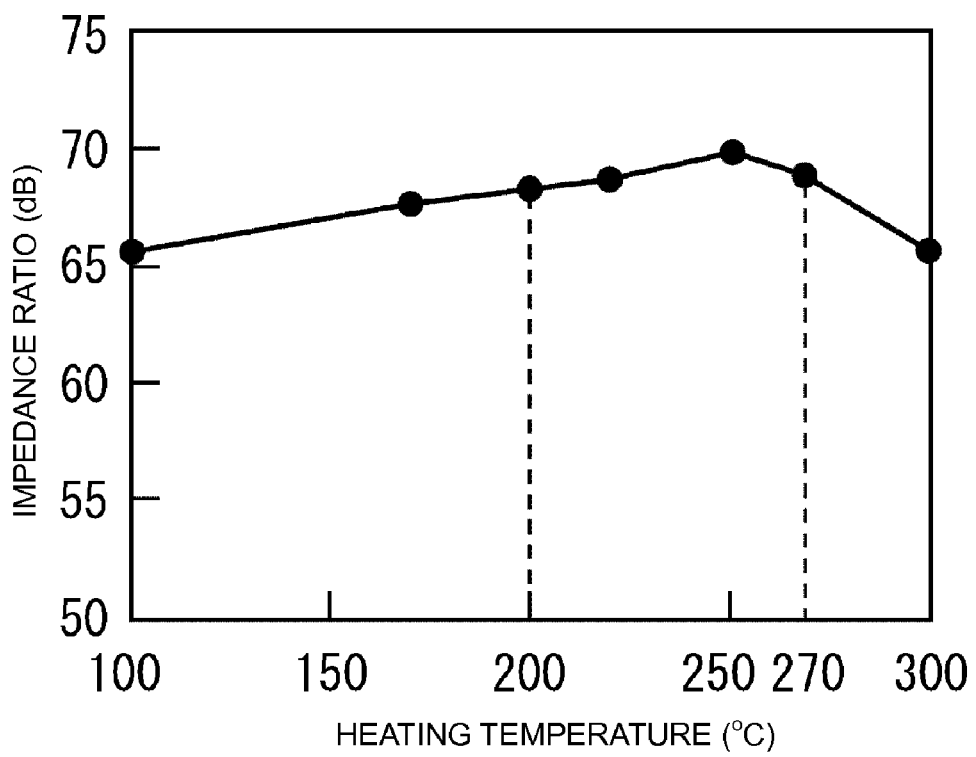

BOUNDARY ACOUSTIC WAVE DEVICE COMPRISING NI DIFFUSED IN AU AND METHOD FOR MANUFACTURING THE SAME

BACKGROUND OF THE INVENTION

1. Field of the Invention

The present invention relates to a boundary acoustic wave device using a boundary acoustic wave propagating between a first medium and a second medium and a method for manufacturing the same. In particular, the present invention relates to a boundary acoustic wave device in which an IDT electrode disposed between the first medium and the second medium is defined by laminated metal films including at least an Au layer defining a main electrode layer and a method for manufacturing the same.

2. Description of the Related Art

Boundary acoustic wave devices are previously known as devices used as resonators and band pass filters. The boundary acoustic wave device has a structure in which an IDT electrode is disposed at the interface between a first medium and a second medium. In the boundary acoustic wave device, a boundary acoustic wave propagating along the interface is used. Therefore, the boundary acoustic wave device can be mechanically supported at surfaces opposite to the interface between the first medium and the second medium. Consequently, a simplified and small-sized package structure can be achieved.

An example of the boundary acoustic wave device is disclosed in WO2004/070946. In the boundary acoustic wave device described in WO2004/070946, an IDT electrode is formed by using Au, Ag, Cu, or Al or an alloy thereof. Furthermore, it is described that in order to improve the adhesion of the IDT electrode to a medium or to improve the electric power withstanding performance, a second electrode layer made of another metal material, e.g., Ti, Cr, or NiCr, may be laminated on at least one surface of the electrode layer made of Au, Ag, Cu, or Al or an alloy thereof.

As is described in WO2004/070946, IDT electrodes primarily made of various metals, e.g., Au, Ag, Cu, or Al or an alloy thereof, are known. Moreover, structures in which second electrode layers made of other metal materials are laminated on the electrode layers made of the metals are also known. However, such structures in which second electrode layers made of other metal materials are laminated have been used for improving the adhesion of the IDT electrodes or improving the electric power withstanding performance, as described above.

On the other hand, where the boundary acoustic wave devices are used as resonators and filters, not only the improvement of the electric power withstanding performance, but also improvements of frequency characteristics, e.g., an insertion loss, in a pass band have been in high demand.

SUMMARY OF THE INVENTION

To overcome the problems described above, preferred embodiments of the present invention provide a boundary acoustic wave device capable of further reducing an insertion loss.

According to a first preferred embodiment of the present invention, a boundary acoustic wave device includes a first medium, a second medium, and an IDT electrode disposed at an interface between the first medium and the second medium, the IDT electrode having an Au layer defining a main electrode layer, wherein the IDT electrode includes the Au layer and a Ni layer disposed so as to contact at least one surface of the Au layer, and a portion of Ni defining the Ni layer is diffused from the Ni layer side surface of the Au layer toward the inside of the Au layer.

According to a second preferred embodiment of the present invention, a boundary acoustic wave device includes a first medium, a second medium, and an IDT electrode disposed at an interface between the first medium and the second medium, the IDT electrode having a Au layer defining a main electrode layer, wherein the IDT electrode includes the Au layer and a Ni layer disposed between the Au layer and the first medium so as to contact the Au layer and a portion of Ni defining the Ni layer is diffused from the Ni layer side surface of the Au layer toward the inside of the Au layer.

The IDT electrode preferably further includes a metal layer disposed on a surface of the Au layer opposite to the side, on which the Ni layer is disposed, the metal layer including Ni, and a portion of Ni defining the Ni layer and the metal layer is diffused from both surfaces of the Au layer toward the inside of the Au layer.

Preferably, a concentration distribution is provided in the Au layer such that the Ni concentration is high concentration-low concentration-high concentration from the Ni layer side surface of the Au layer toward the metal layer side surface of the Au layer.

Preferably, a second metal layer disposed on the metal layer and which is Al or primarily includes Al is further included.

A method for manufacturing a boundary acoustic wave device according to another preferred embodiment of the present invention including a first medium, a second medium, and an IDT electrode disposed at an interface between the first medium and the second medium, includes the steps of forming a Au layer and a Ni layer disposed so as to contact at least one surface of the Au layer on a surface of one of the first medium and the second medium, laminating the other of the first medium and the second medium after the Au layer and the Ni layer are formed, and diffusing a portion of Ni defining the Ni layer into the Au layer by heating after the Au layer and the Ni layer are formed.

Preferably, the diffusing of the Ni is conducted in the step of laminating the other of the first medium and the second medium.

Preferably, the IDT electrode includes the Ni layer disposed so as to contact at least one surface of the Au layer defining the main electrode layer, and a portion of Ni defining the Ni layer is diffused from the Ni layer side surface of the Au layer toward the inside of the Au layer. Therefore, an insertion loss in a pass band is reduced.

Preferably, the IDT electrode includes an Au layer and a Ni layer disposed so as to contact the Au layer, and a portion of Ni defining the Ni layer is diffused from the Ni layer side surface of the Au layer towards the inside of the Au layer. Therefore, an insertion loss in a pass band can be reduced.

The Ni layer is disposed so as to contact the Au layer, a portion of Ni is diffused from the Ni layer side surface of the Au layer into the inside of the Au layer and, thereby, the insertion loss is reduced. The reason for this is believed that the Au layer is partially hardened because of the diffusion of Ni into the Au layer, a strain between the medium and IDT due to an acoustic wave is suppressed and, thereby, the insertion loss is reduced.

Consequently, as described above, a boundary acoustic wave device having a reduced loss can be provided by devising a material defining the IDT electrode.

Where a metal layer including Ni is disposed on a surface of the Au layer opposite to the side on which the Ni layer is disposed, and a portion of Ni in the Ni layer and the metal layer is diffused from both surfaces of the Au layer towards the inside of the Au layer, the vicinity of both surfaces of the Au layer becomes harder than the center portion in the thickness direction of the Au layer. Consequently, the damping can be suppressed and a loss can be further reduced. In this case, the Ni concentration in the Au layer has a concentration distribution in which high concentration-low concentration-high concentration is provided from one surface toward the other surface side. Therefore, as described above, the high concentration portion is hardened and, thereby, the loss is reduced. On the other hand, a loss of the resistance is reduced in the central low concentration portion. Therefore, the IDT electrode functions satisfactorily as an electrode.

The second metal layer disposed on the metal layer which is Al or primarily includes Al may be further included. In that case, since the electrical resistivity of the second metal layer is relatively low and since the second electrode layer is relatively soft, it becomes possible to further reduce the electrical resistance and further reduce the loss.

In the manufacturing method according to preferred embodiments of the present invention, the steps of laminating the first medium and the second medium after the Au layer and the Ni layer disposed so as to contact at least one surface of the Au layer are formed on a surface of one of the first medium and the second medium and diffusing a portion of Ni defining the Ni layer into the Au layer by heating are conducted. Therefore, a portion of Ni is diffused into the Au layer from the surface of the Au layer on which the Ni layer is laminated. Consequently, the boundary acoustic wave device according to the first preferred embodiment of the present invention can be provided, and the insertion loss in the pass band can be reduced.

Where the diffusing Ni is conducted at the same time with the lamination in the laminating the first medium and the second medium, Ni can be diffused into the Au layer without increasing the number of steps.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIG. 8 is a diagram showing the relationship between the film formation temperature of $SiO_2$ defining a second medium and the impedance ratio of the resulting boundary acoustic wave device.

DETAILED DESCRIPTION OF PREFERRED EMBODIMENTS

The present invention will be made clear by describing the specific preferred embodiments of the present invention with reference to the drawings.

First Preferred Embodiment

Figure 1A:
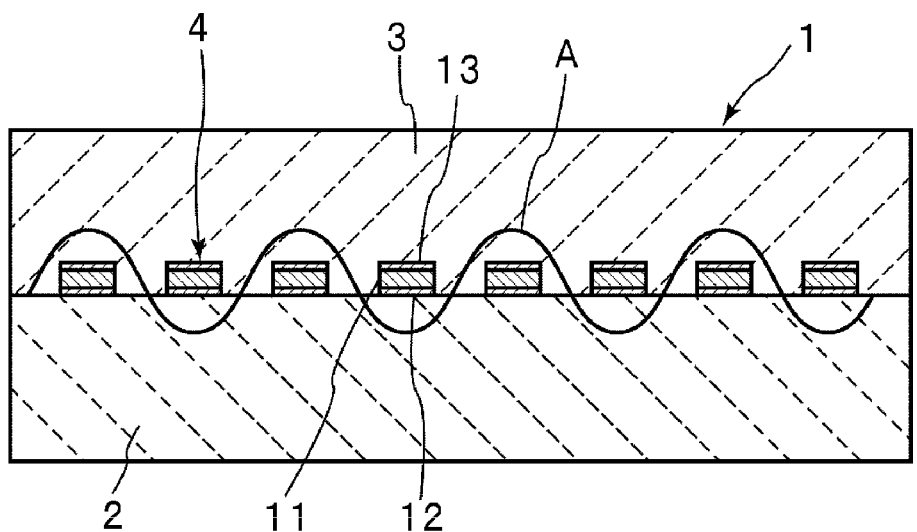
FIGS. 1A and 1B are a schematic cutaway sectional front view and a sectional plan view of a boundary acoustic wave device according to a preferred embodiment of the present invention.
Figure 1B:
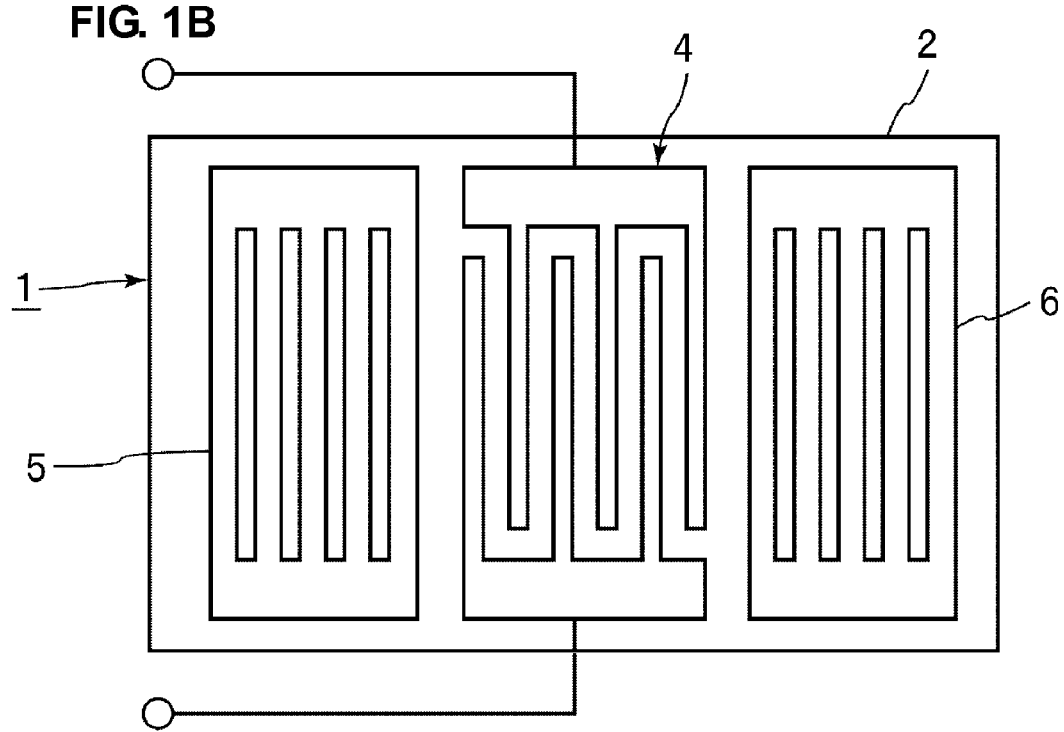

FIGS. 1A and 1B are a schematic cutaway sectional front view and a sectional plan view of a boundary acoustic wave device according to the first preferred embodiment of the present invention.

A boundary acoustic wave device 1 includes a first medium 2 and a second medium 3 that are laminated together. The first medium 2 is made of a piezoelectric substance and is preferably made of a Y-cut X-propagation $LiNbO_3$ single crystal substrate in the present preferred embodiment. The first medium 2 may be made of another piezoelectric crystal or piezoelectric ceramic.

The second medium 3 is made of an appropriate dielectric substance or piezoelectric substance and is preferably made of $SiO_2$ in the present preferred embodiment.

An IDT electrode 4 is disposed at the interface between the first medium 2 and the second medium 3. Reflectors 5 and 6, as shown in FIG. 1B, are disposed on both sides of the IDT electrode 4 in the propagation direction of a boundary acoustic wave. The IDT electrode 4 includes a pair of interdigital transducer electrodes having a plurality of electrode fingers interdigitated with each other. In the IDT electrode 4, a boundary acoustic wave is excited by applying an alternating current electric field between one interdigital transducer electrode and the other interdigital transducer electrode. The boundary acoustic wave propagates along the interface between the first medium 2 and the second medium 3 as schematically indicated by a solid line A shown in FIG. 1A. The boundary acoustic wave A is trapped between the reflectors 5 and 6, and resonance characteristics as a one port type boundary acoustic wave resonator are obtained.

Figure 2:
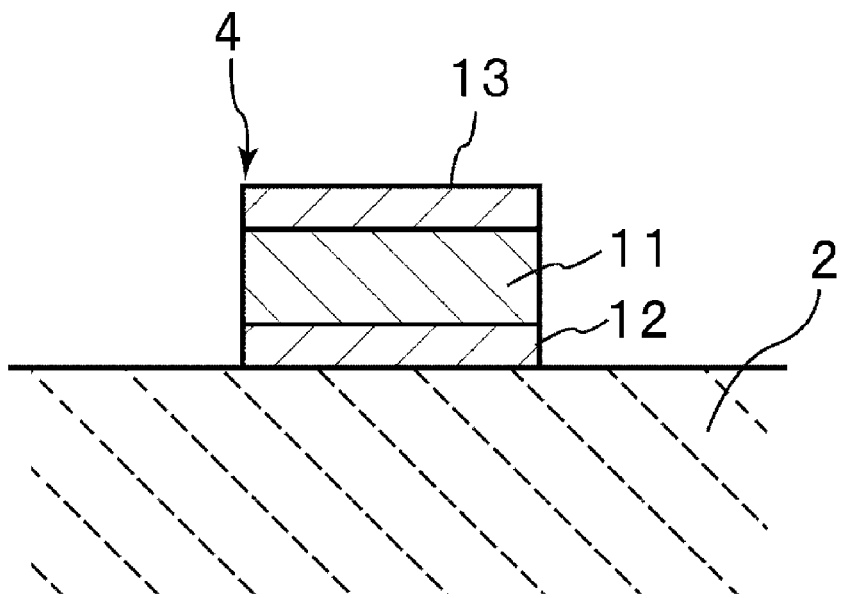
FIG. 2 is a schematic sectional front view showing a magnified electrode lamination structure of a boundary acoustic wave device of a first preferred embodiment of the present invention.

One of the unique features of the boundary acoustic wave device 1 of the present preferred embodiment is that the IDT electrode 4 includes a plurality of electrode layers that are laminated together. That is, as shown in FIG. 1A and FIG. 2 showing a magnified electrode finger, the electrode structure in the IDT electrode 4 includes a Au layer 11 defining a main electrode layer, a Ni layer 12 disposed on the bottom surface of the Au layer 11, and a Ni layer 13 defining a metal layer disposed on the top surface of the Au layer 11. That is, the Ni layer 12 is disposed on the first medium 2 side of the Au layer 11.

The main electrode layer refers to a principal electrode layer in the IDT electrode 4 including the laminated metal layers. Here, the principal electrode layer refers to an electrode layer which functions as the nucleus of electrode function in laminated metal films formed by laminating a plurality of electrode layers, that is, metal films. More specifically, the main electrode layer is made of a metal film having the largest thickness among the plurality of metal films.

A portion of Ni defining the Ni layers 12 and 13 is diffused into the Au layer 11. Consequently, the insertion loss can be reduced in the present preferred embodiment. This will be specifically described.

The IDT electrode 4 and the reflectors 5 and 6 were formed on the first medium 2 defined by the $LiNbO_3$ single crystal substrate such that the thicknesses of Ni layer 13/Au layer 11/Ni layer 12 became 10 nm/170 nm/10 nm, and the IDT electrode 4 and the reflectors 5 and 6 were formed such that the wavelength $\lambda$ defined by an electrode finger pitch in the IDT electrode 4 was about 3.42 μm. In the IDT electrode 4, the number of pairs of electrode fingers was 50 pairs, the cross width was about 30$\lambda$, and the duty of the electrode finger was about 0.55. The number of electrode fingers in each of the reflectors 5 and 6 was 25 fingers. The wavelength defined by the period of the electrode finger in the IDT electrode 4 and the wavelength defined by the period of the electrode finger in the reflectors 5 and 6 were substantially the same and were set to be $\lambda$. The distance between the IDT electrode 4 and the reflector 5 or the reflector 6 was about 0.5$\lambda$ measured as the distance between centers of electrode fingers.

The IDT electrode 4 and the reflectors 5 and 6 were prepared by forming the Ni layer 12 on the first medium 2, forming the Au layer 11, and forming the Ni layer 13. The Ni layer 12, Au layer 11, and Ni layer 13 are formed by a lift-off method, for example. After the Ni layer 13 was formed, the second medium 3 was formed and laminated on the first medium 2.

The second medium 3 was formed by RF magnetron sputtering $SiO_2$. In the sputtering, the heating temperature of the $LiNbO_3$ substrate defining the first medium 2 was specified to be about 250° C. It is believed that since the heating to about 250° C. was performed, a portion of Ni defining the Ni layers 12 and 13 was diffused into the Au layer 11.

The resonance characteristic of the boundary acoustic wave device 1 of the present preferred embodiment produced as described above was measured and the impedance ratio was determined. The impedance ratio refers to a ratio of the impedance at an antiresonant frequency to the impedance at a resonant frequency. As the impedance ratio increases, losses in a resonator and a filter are reduced.

For purposes of comparison, a boundary acoustic wave device having the same configuration as that described above was produced except that the lamination structure of the IDT electrode 4 and the reflectors 5 and 6 was Ti/Au/Ti, NiCr/Au/NiCr, Ti/Au/NiCr, or Ni/Au/NiCr from the top surface side of the IDT electrode, and the resonance characteristic and the impedance ratio were determined.

As for a first modified example of the first preferred embodiment, a boundary acoustic wave device having the same configuration as that in the preferred embodiment was produced except that the metal layer 13 was changed from Ni to NiCr, and the resonance characteristic and the impedance ratio were determined. The results are shown in FIG. 3 to FIG. 6.

Figure 3:
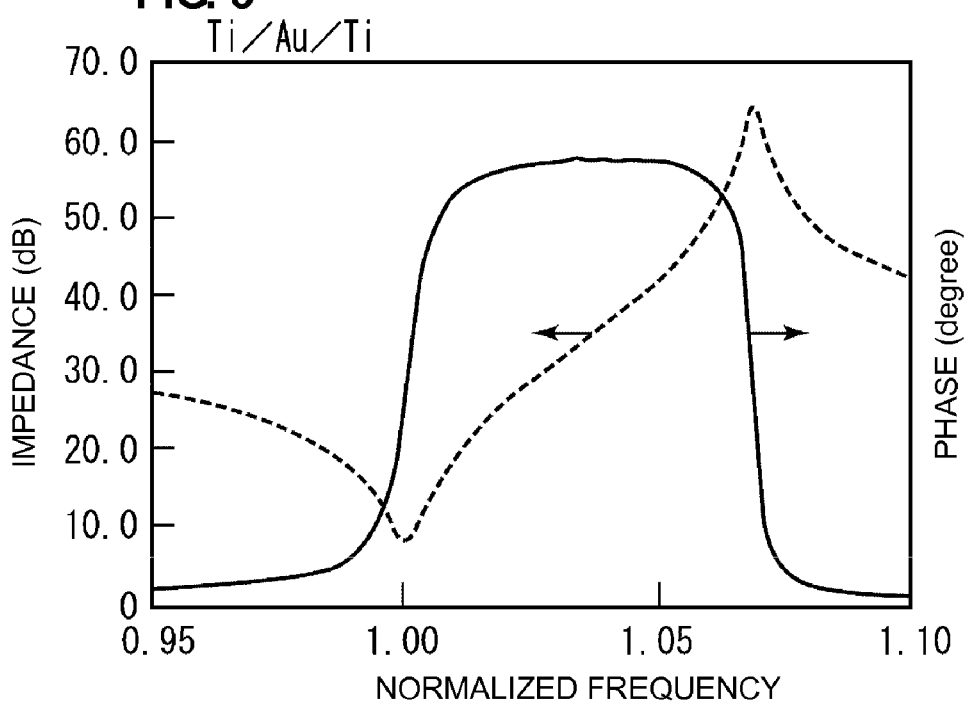
FIG. 3 is a diagram showing the impedance and the phase characteristics of a boundary acoustic wave device prepared as a comparative example.
Figure 4:
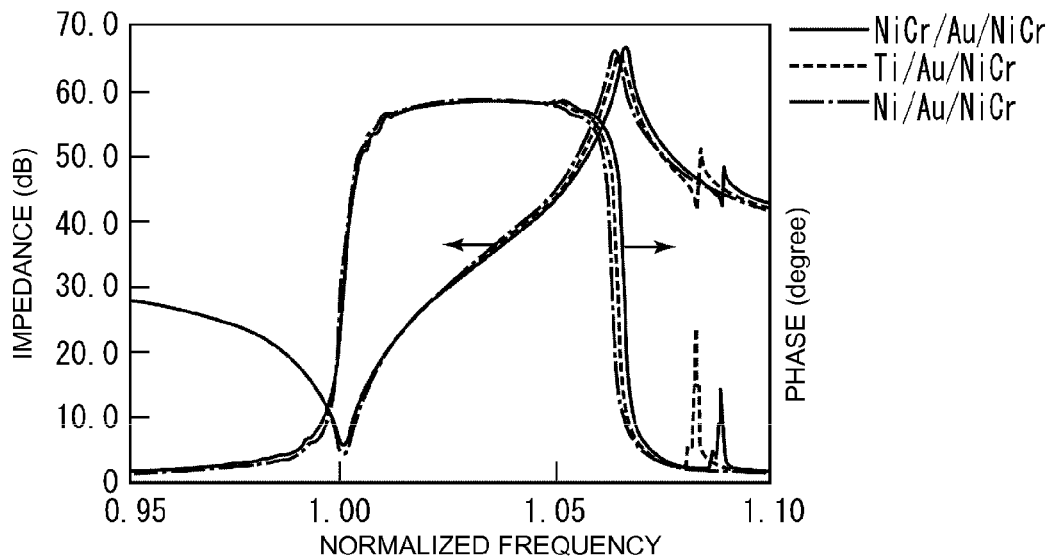
FIG. 4 is a diagram showing the impedance and the phase characteristics of a plurality of boundary acoustic wave devices prepared as comparative examples.
Figure 5:
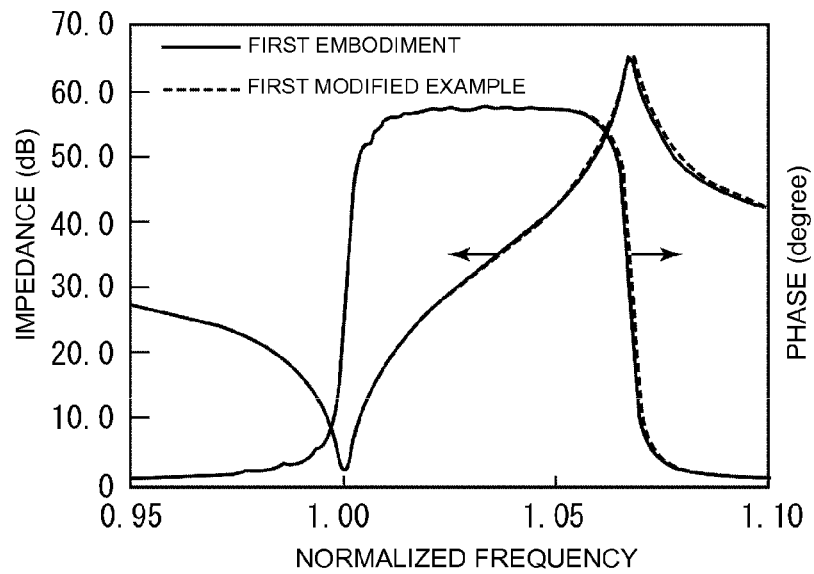
FIG. 5 is a diagram showing the impedance and the phase characteristics of boundary acoustic wave devices of the first preferred embodiment and a first modified example.
Figure 6:
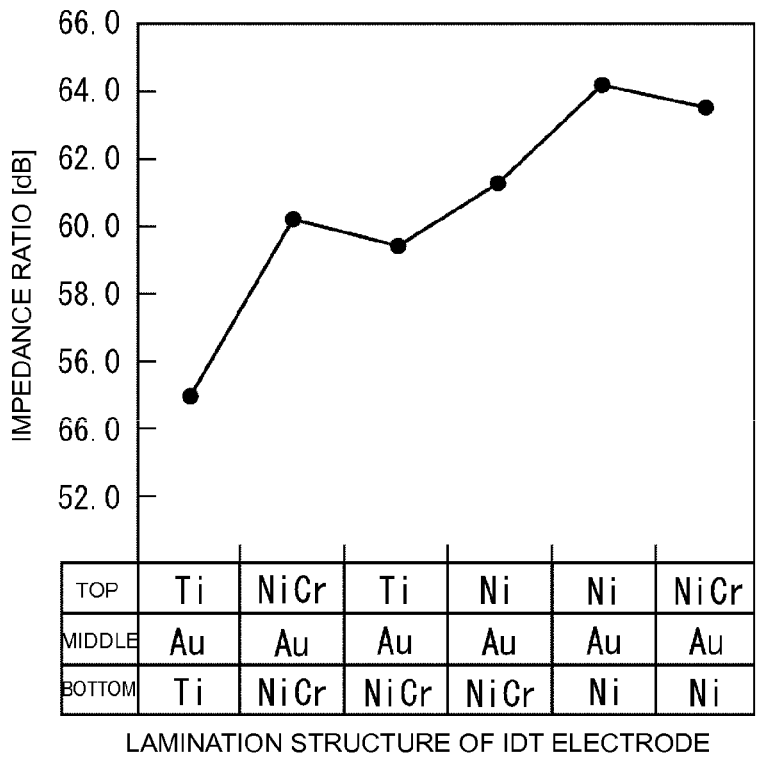
FIG. 6 is a diagram showing the impedance ratios of boundary acoustic wave devices of the first preferred embodiment, the first modified example, and a plurality of types prepared for comparison.

FIG. 3 shows the impedance and the phase characteristics of the boundary acoustic wave device of the comparative example having the electrode lamination structure composed of Ti/Au/Ti. FIG. 4 shows the impedance and the phase characteristics of a plurality of comparative examples in which the side in contact with the first medium is the NiCr layer. FIG. 5 shows the impedance and the phase characteristics of the first preferred embodiment and the first modified example. FIG. 6 shows the impedance ratio of each of the comparative examples, example, and modified example.

As shown in FIG. 6, regarding the 4 types of comparative examples, the impedance ratios remained about 61 dB or less. On the other hand, with the first preferred embodiment, the impedance ratio exceeded about 64 dB, and regarding the first modified example, the impedance ratio was about 64.0 dB. This is also evident from comparisons of the impedance waveforms shown in FIG. 3 and FIG. 4 with the impedance waveform shown in FIG. 5.

Therefore, it is clear that in the first preferred embodiment and the first modified example, boundary acoustic wave devices exhibiting reduced losses can be provided. The inventor of the present invention discovered that the impedance ratio was able to be increased and the loss was able to be reduced in the first preferred embodiment and the first modified example because a portion of Ni was diffused into the Au layer 11 from the Ni layers 12 and 13 or the Ni layer 12 and the NiCr layer.

Figure 7:
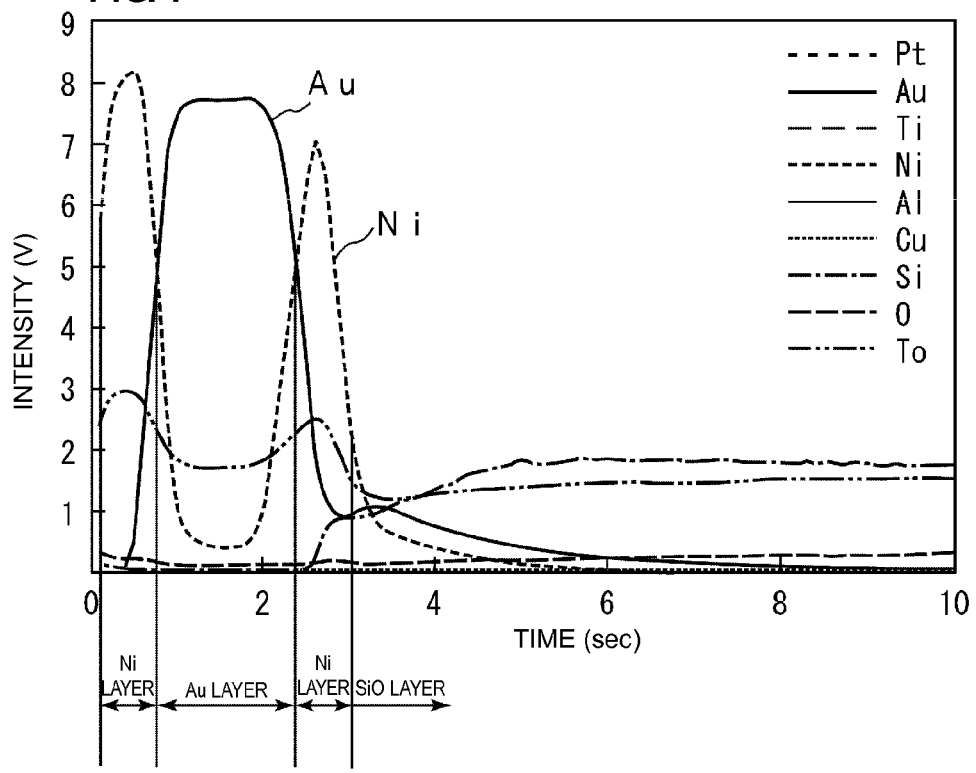
FIG. 7 is a diagram showing a diffusion profile of Ni into an Au layer and shows changes in the concentrations of atoms in a main electrode layer.

That is, Ni defining the Ni layers 12 and 13 or Ni defining the Ni layer 12 and the NiCr layer is thermally diffused into the Au layer 11 because of heating during the film formation of $SiO_2$ defining the second medium 3 by magnetron sputtering. FIG. 7 is a diagram showing a composition analysis line profile for indicating the concentration distribution of the IDT electrode 4 in the boundary acoustic wave device of the first preferred embodiment. In FIG. 7, the time indicated by the horizontal axis corresponds to the distance from the surface of the first medium 2, in other words, shows the position in the IDT electrode 4. In FIG. 7, the first region in which the intensity of the Ni element is relatively high and the time is greater than 0 corresponds to the Ni layer 12, the next region in which the intensity of Au element is high corresponds to the Au layer 11, and the next region in which the intensity of Ni element is high corresponds to the Ni layer 13.

In FIG. 7, the Ni concentration increases in the region in which the intensity of Au element is high and which corresponds to the Au layer 11, and it is clear that Ni diffuses into the Au layer. It is believed that such diffusion of Ni into the Au layer 11 occurs because the Ni layers 12 and 13 or the Ni layer 12 and the NiCr layer are disposed so as to contact the Au layer 11 and Ni is thermally diffused into the Au layer during heating in the film formation of the second medium 3.

Where a portion of Ni is diffused into the Au layer 11, the impedance ratio increases and the loss is reduced. The reason for this is believed to be as described below.

Figure 12:
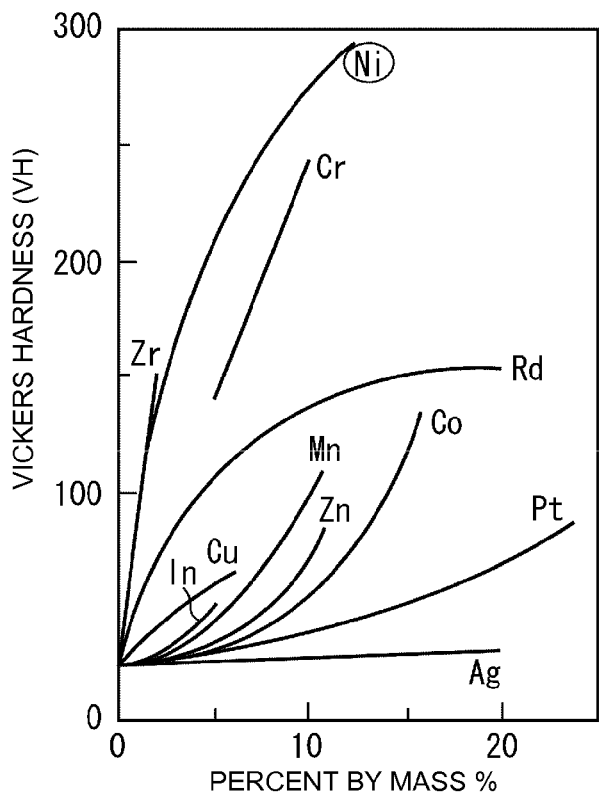
FIG. 12 is a diagram showing the relationship between the contents of elements and the Vickers hardness of an electrode layer in the case where various elements are added to the Au layer.
Figure 13:
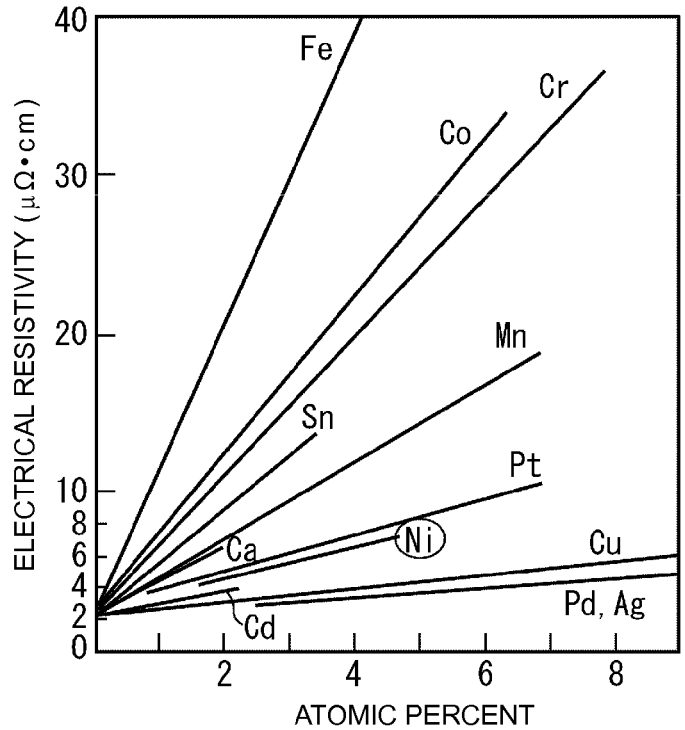
FIG. 13 is a diagram showing the relationship between the contents of elements and the electrical resistivity of an electrode layer in the case where various elements are added to the Au layer.

FIG. 12 and FIG. 13 show the relationship between the Vickers hardness of an electrode layer and the percent by mass indicating the content where another metal, e.g., Ni, is added to the Au layer. FIG. 12 is a diagram showing the relationship between the electrical resistivity and element percent indicating the content of the element added.

As shown in FIG. 12 and FIG. 13, as the Ni content increases, the hardness of the electrode layer increases and the electrical resistivity also increases slightly.

Consequently, if Ni diffuses into the Au layer 11, a portion of the Au layer 11 into which Ni has diffused is hardened. It is believed that a loss by damping due to the Au layer 11 is thereby reduced, the propagation loss of the boundary acoustic wave is reduced, and the impedance ratio increases.

That is, a portion of the Au layer is hardened because of the diffusion of Ni into the Au layer and, in particular, if Ni in the Ni layer disposed on the first medium side diffuses from the Ni layer 12 side surface of the Au layer 11 into the Au layer 11, the impedance ratio is increased and the loss is reduced by the mechanism.

As is clear from the modified example, where the metal layer disposed on the Au layer 11 is made of NiCr, it is believed that Ni defining the Ni layer 12 and the NiCr layer diffuses to the Au layer 11 side, the propagation loss of boundary acoustic wave is reduced, and the impedance ratio is increased. However, where the Ni layers 12 and 13 are disposed on two surfaces of the Au layer 11 as in the first preferred embodiment, after thermal diffusion, a concentration distribution occurs such that the concentration of Ni becomes high concentration-low concentration-high concentration from one surface side of the Au layer toward the other surface side. In this case, it is believed that the damping loss is reduced, the propagation loss of boundary acoustic wave is further reduced, and, thereby, the impedance ratio is increased. The high concentrations may be different in the degrees of high concentration and can be controlled by the thickness.

However, if the amount of diffusion is too large, the electrical resistance of the Au layer 11 may increase. That is, if Ni is diffused at high concentrations throughout the thickness direction of the Au layer 11, the electrical resistance increases and the function of the Au layer 11 as the main electrode layer is adversely affected. Therefore, regarding the structure in which a layer including Ni is laminated on both surfaces of the Au layer, preferably, the Au layer 11 is formed so as to have a concentration distribution of high concentration-low concentration-high concentration from one surface of the Au layer toward the other surface. In this case, an increase in the electrical resistance can be prevented in the central low concentration portion and, furthermore, the vicinity of the Ni layer 12 side surface of the Au layer 11 is hardened, so that the loss can be reduced, as described above.

In the production of the boundary acoustic wave device of the first preferred embodiment, the heating temperature in the film formation of the SiO$_2$ film defining the second medium 3 is about 250° C. However, this heating temperature is not limited to about 250° C. It was determined that Ni is diffused into the Au layer favorably and that similar effects are achieved in the range of about 150° C. to about 300° C. That is, FIG. 8 is a diagram showing the results of measurements of impedance ratios of boundary acoustic wave devices produced as in the above-described preferred embodiment except that the film formation temperature was changed within the range of about 100° C. to about 300° C.

As shown in FIG. 8, the impedance ratios are high when the film formation temperatures are within the range of about 150° C. to about 300° C. and, the range of about 200° C. to about 270° C. is more preferable.

In the above-described preferred embodiment, Ni is diffused into the Au layer 11 by the heating in the film formation of the SiO$_2$ film defining the second medium 3. However, the heating in the film formation is not necessarily used for diffusion depending on the heating temperature in the film formation of the second medium 3. That is, prior to the formation of the second medium 3, a step of heating the IDT electrode 4 may be introduced so as to diffuse Ni into the Au layer 11. Alternatively, the step of heating the IDT electrode 4 may be introduced after the second medium 3 is formed. That is, the heating step for diffusing Ni may be conducted as a separate step from the step of laminating the second medium 3 on the first medium 2.

However, it is preferable that the thermal diffusion of Ni is also conducted in the heating step for laminating the second medium 3 on the first medium 2, as in the present preferred embodiment. In that case, no separate heating step is required for thermal diffusion. Consequently, an addition of a step is avoided, and energy can be saved.

Second Preferred Embodiment

A boundary acoustic wave device was produced as in the first preferred embodiment except that the lamination structure of the IDT electrode and the reflectors was formed by using photolithography and dry etching so as to become a lamination structure of AlCu/Ti/Ni/Au/Ni/Ti from the second medium 3 side toward the first medium 2 side.

That is, in the present preferred embodiment, the center portion in the thickness direction of the IDT electrode has a lamination structure of Ni/Au/Ni as in the first preferred embodiment. Therefore, Ni layers are laminated on the top and the bottom of the Au layer defining a main electrode layer. In this case, the lower Ni layer is the Ni layer disposed on the first medium side and the upper Ni layer corresponds to the Ni layer defining the metal layer.

In the present preferred embodiment, a Ti layer is further laminated as a foundation of the lamination portion in which the Ni/Au/Ni is laminated, and a Ti layer and an AlCu layer are further laminated sequentially. Here, the film thickness of each layer of the IDT electrode was specified to be AlCu/Ti/Ni/Au/Ni/Ti=100/10/10/77/10/10 nm.

In the second preferred embodiment, it was determined that a portion of Ni defining the Ni layers located at both sides of the Au layer was diffused into the Au layer during heating in the film formation of the second medium 3 made of SiO$_2$, as in the first preferred embodiment, and a reduction in the insertion loss was achieved, as in the first preferred embodiment.

Furthermore, since the AlCu layer having a small electrical resistivity and a density similar to that of SiO$_2$ is laminated on the side of the second medium 3 made of SiO$_2$, the electrical resistivity of the electrode can be reduced without deteriorating the resonance characteristic and, thereby, the resistance loss is reduced. The Ti layer defining the foundation has reactivity with oxygen and acts such that the adhesion between the first medium 2 of an oxide substrate and the electrode is improved. Consequently, in the first preferred embodiment, the adhesion to the LiNbO$_3$ substrate defining the first medium 2 of the IDT electrode is improved and the reliability of the boundary acoustic wave device is improved.

As described above, even when the Ti layer is provided as the foundation, the insertion loss can be reduced according to the second preferred embodiment of the present invention. This will be described with reference to FIGS. 9A and 9B.

Figure 9A:
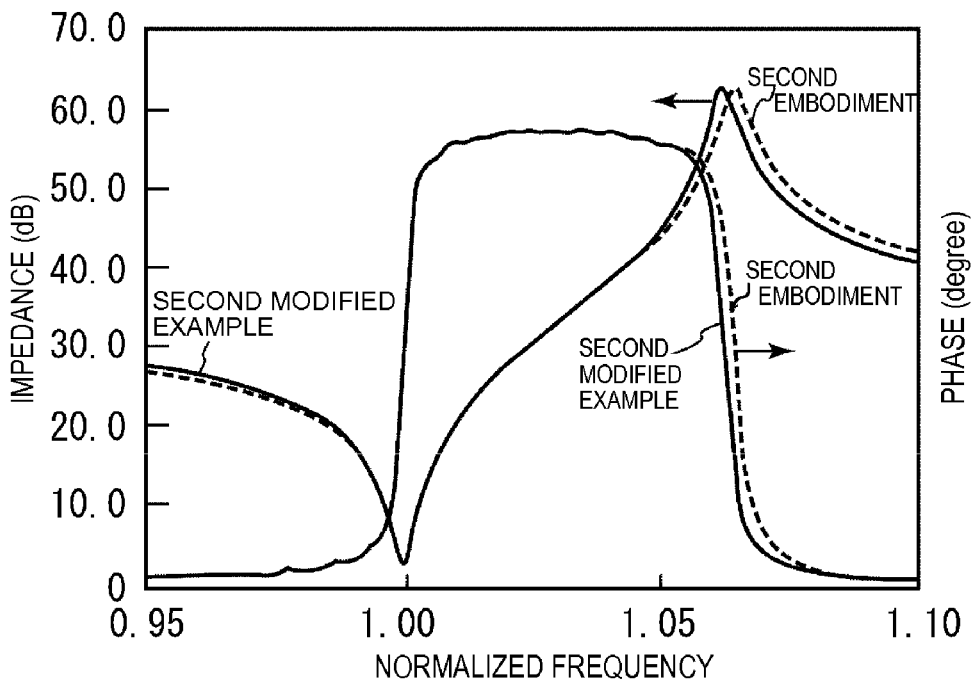
FIGS. 9A and 9B are diagrams showing the impedance phase characteristics and the impedance ratios, respectively, of a second preferred embodiment in which a Ti layer defining a foundation layer is disposed and a second modified example in which a Ti layer defining a foundation layer is not disposed.

A boundary acoustic wave device of a second modified example was prepared having substantially the same configuration as that in the second preferred embodiment except that the Ti layer defining the foundation layer disposed on the second medium 2 side was not provided. The impedance and the phase characteristics of the boundary acoustic wave devices of the second preferred embodiment and the second modified example were measured. The results are shown in FIG. 9A. Furthermore, the impedance ratios obtained from the impedance characteristics are shown in FIG. 9B.

Figure 9B:
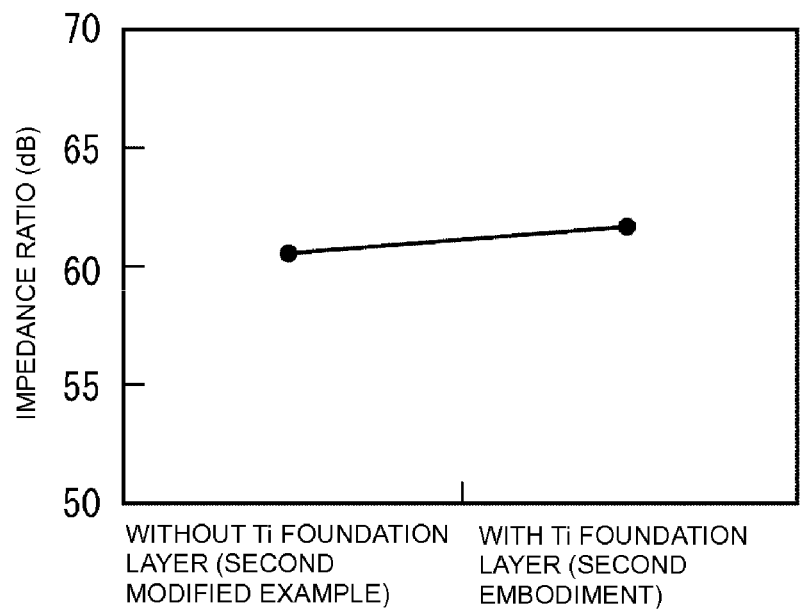

As shown in FIGS. 9A and 9B, even if the Ti layer defining the foundation layer is disposed under the Ni layer, the impedance characteristic is not changed significantly as compared to that of the case where a Ti layer is not disposed as the foundation. That is, it is clear that the adhesion of the IDT electrode can be improved without causing a deterioration of the characteristic.

In the second preferred embodiment, the Ti layer is laminated between the AlCu layer defining the uppermost portion and the Ni layer defining the metal layer above the Au layer. In this case, an increase in resistance due to mutual diffusion between Al and Au is prevented. This will be described with reference to FIG. 10.

Figure 10:
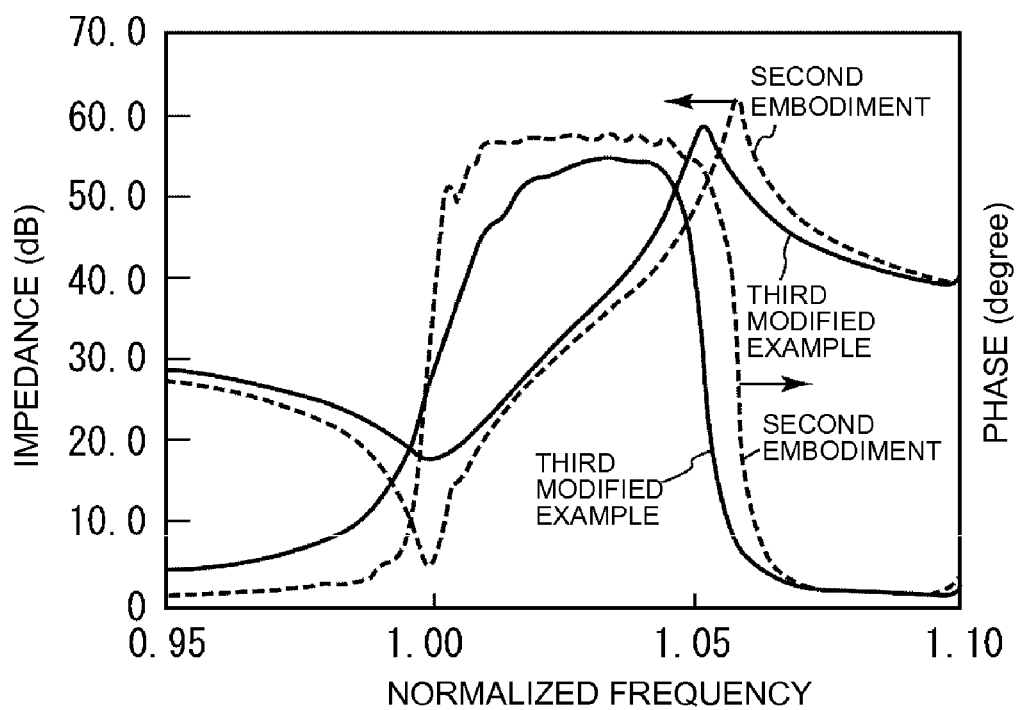
FIG. 10 is a diagram showing the impedance phase characteristics of boundary acoustic wave devices of the second preferred embodiment having a structure in which an AlCu layer is laminated on a Ni layer defining a second electrode layer and, in the structure, a Ti layer is disposed between the AlCu layer and the Ni layer and a third modified example having a structure in which a Ti layer is not laminated.

A boundary acoustic wave device of a third modified example was produced having substantially the same configuration as that in the second preferred embodiment except that the upper Ti layer was not disposed between the AlCu layer and the Ni layer, and the impedance-frequency characteristic and the phase characteristic were found. FIG. 10 shows the impedance and the phase characteristics of the second preferred embodiment and the third modified example. As shown in FIG. 10, in the case of the third modified example in which an upper Ti layer is not disposed, the impedance ratio is relatively small. The reason for this is believed to be that in the case where a Ti layer is not disposed between AlCu and Au, the resistance is increased due to mutual diffusion between Al and Au and, thereby, the characteristics are deteriorated.

Figure 11A:
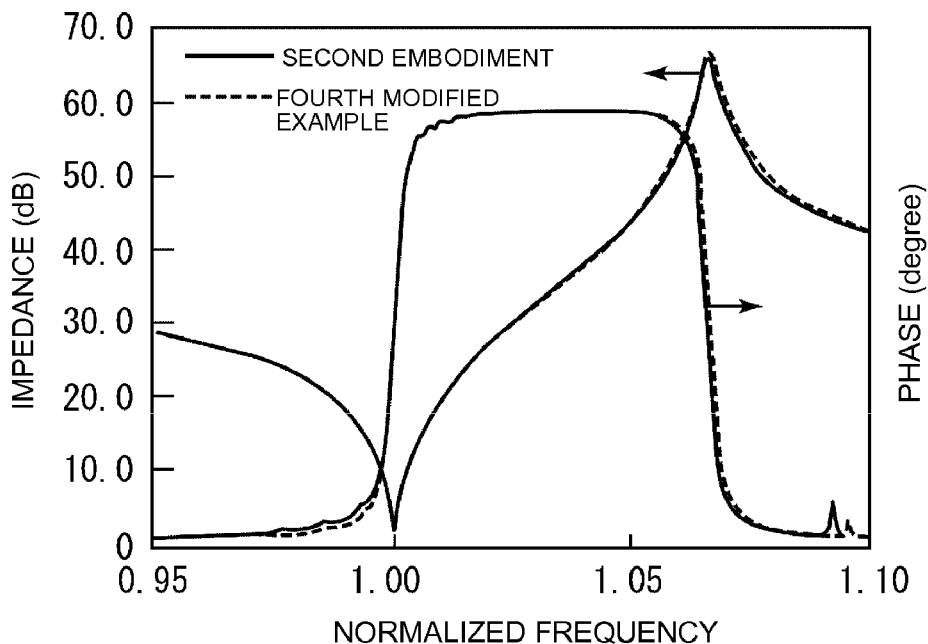
FIGS. 11A and 11B are a diagram showing the impedance and the phase characteristics and a diagram showing the impedance ratio of the second preferred embodiment including an Al layer laminated and a fourth modified example including no Al layer laminated.

In the second preferred embodiment, the AlCu layer defining the metal layer including Al is disposed at the uppermost portion of the IDT electrode 4. In this case, the AlCu layer has a density similar to that of $SiO_2$ defining the second medium 3 and a relatively small electrical resistivity. Therefore, since the IDT electrode 4 having a small electrical resistance can be formed and, in addition, the density is close to that of $SiO_2$, stress transfer between the second medium 3 and the IDT electrode 4 is smoothly conducted, and the impedance ratio is increased. This will be described with reference to FIGS. 11A and 11B. The boundary acoustic wave device of the second preferred embodiment and, for purposes of comparison, a boundary acoustic wave device of a fourth modified example having substantially the same configuration as that of the second preferred embodiment except that the AlCu layer was not laminated as the uppermost portion were prepared, and the impedance phase characteristics were measured. The results are shown in FIG. 11A. The impedance ratios of the second preferred embodiment and the fourth comparative example are shown in FIG. 11B.

Figure 11B:
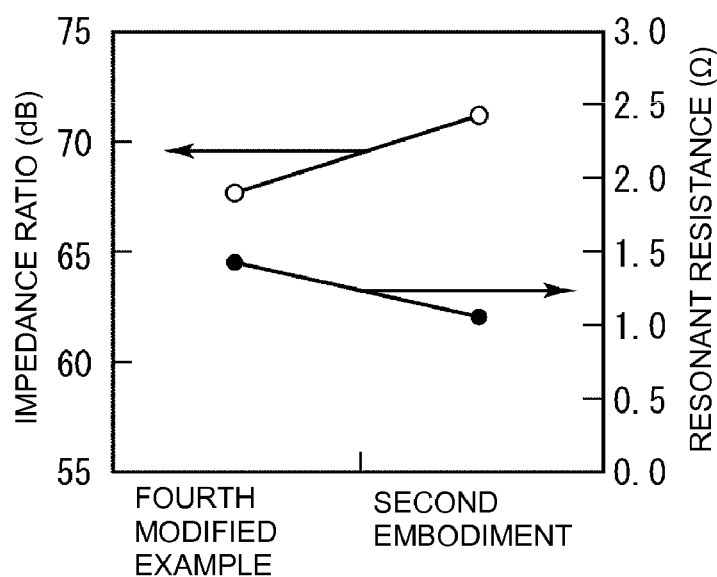

As shown in FIGS. 11A and 11B, according to the second preferred embodiment, the impedance ratio is increased as compared to that in the fourth modified example.

In the second preferred embodiment, AlCu is preferably used as the material for the second metal layer having a density similar to that of $SiO_2$ defining the second medium 3 and a small electrical resistivity. However, a material including Al as a primary component and including at least one type of Cu, Ti, Mg, Ni, Mo, Sc, and Ta or pure Al may be used.

Regarding the above-described preferred embodiments, boundary acoustic wave resonators preferably have been described. However, the present invention can be applied to other boundary acoustic wave devices, e.g., boundary acoustic wave filters. That is, the effects of minimizing and preventing a propagation loss due to the diffusion of Ni can be used to reduce the insertion loss and prevent deterioration of sharpness in the attenuation characteristic of the boundary acoustic wave filter and, therefore, a boundary acoustic wave filter device having a reduced loss can be provided according to various preferred embodiments of the present invention.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A boundary acoustic wave device comprising:
   a first medium;
   a second medium; and
   an IDT electrode disposed at an interface between the first medium and the second medium, the IDT electrode having an Au layer defining a main electrode layer; wherein
   the IDT electrode includes the Au layer and a Ni layer disposed so as to contact at least one surface of the Au layer; and
   a portion of Ni defining the Ni layer is diffused from the Ni layer side surface of the Au layer toward the inside of the Au layer.

2. The boundary acoustic wave device according to claim 1, wherein the IDT electrode further comprises:
   a metal layer disposed on a surface of the Au layer opposite to the at least one surface at which the Ni layer contacts the Au layer, the metal layer including Ni; and
   a portion of Ni defining the Ni layer and the metal layer is diffused from both surfaces of the Au layer toward the inside of the Au layer.

3. The boundary acoustic wave device according to claim 2, wherein the Au layer has a concentration distribution such that a Ni concentration is high concentration-low concentration-high concentration from the Ni layer side surface of the Au layer toward the metal layer side surface of the Au layer.

4. The boundary acoustic wave device according to claim 2, further comprising a second metal layer disposed on the metal layer and which is Al or primarily includes Al.

5. A boundary acoustic wave device comprising:
   a first medium;
   a second medium; and
   an IDT electrode disposed at an interface between the first medium and the second medium, the IDT electrode having an Au layer defining a main electrode layer; wherein
   the IDT electrode includes the Au layer and a Ni layer disposed between the Au layer and the first medium so as to contact the Au layer; and
   a portion of Ni defining the Ni layer is diffused from the Ni layer side surface of the Au layer toward the inside of the Au layer.

6. The boundary acoustic wave device according to claim 5, wherein the IDT electrode further comprises:
   a metal layer disposed on a surface of the Au layer opposite to the side on which the Ni layer is disposed, the metal layer including Ni; and a portion of Ni defining the Ni layer and the metal layer is diffused from both surfaces of the Au layer toward the inside of the Au layer.

7. The boundary acoustic wave device according to claim 6, wherein the Au layer has a concentration distribution such that a Ni concentration is high concentration-low concentration-high concentration from the Ni layer side surface of the Au layer toward the metal layer side surface of the Au layer.

8. The boundary acoustic wave device according to claim 6, further comprising a second metal layer disposed on the metal layer and which is Al or primarily includes Al.

9. A method for manufacturing a boundary acoustic wave device including a first medium, a second medium, and an IDT electrode disposed at an interface between the first medium and the second medium, the method comprising the steps of:

forming an Au layer and a Ni layer disposed so as to contact at least one surface of the Au layer on a surface of one of the first medium and the second medium;

laminating the other of the first medium and the second medium after the Au layer and the Ni layer are formed; and diffusing a portion of Ni defining the Ni layer into the Au layer by heating after the Au layer and the Ni layer are formed.

10. The method for manufacturing a boundary acoustic wave device according to claim 9, wherein the diffusing of Ni is performed during the step of laminating the other of the first medium and the second medium.

* * * * *